United States Patent
Takahashi

[19]

[11] Patent Number: 5,914,000
[45] Date of Patent: Jun. 22, 1999

[54] APPARATUS FOR MANUFACTURING SEMICONDUCTOR DEVICE AND METHOD OF REMOVING SILICON OXIDATION FILM

[75] Inventor: Hironari Takahashi, Tokyo, Japan

[73] Assignee: Mitsubishi Denki Kabushiki Kaisha, Tokyo, Japan

[21] Appl. No.: 08/651,544

[22] Filed: May 22, 1996

[30] Foreign Application Priority Data

Feb. 6, 1996 [JP] Japan .................................. 8-019721

[51] Int. Cl.⁶ .............................. C23C 16/42; C23F 1/08
[52] U.S. Cl. ................................. 156/345; 118/723 MP; 118/724; 118/710
[58] Field of Search ................... 118/663–733; 156/345, 345 V, 345 MC

[56] References Cited

U.S. PATENT DOCUMENTS

| | | | |
|---|---|---|---|
| 4,818,327 | 4/1989 | Davis et al. | 156/345 |
| 5,336,356 | 8/1994 | Ban et al. | 156/345 |
| 5,584,963 | 12/1996 | Takahashi | 134/22.1 |
| 5,616,208 | 4/1997 | Lee | 156/345 |

FOREIGN PATENT DOCUMENTS

| | | | |
|---|---|---|---|
| 4417205 | 11/1994 | Germany | H01L 21/306 |
| 3 204932 | 9/1991 | Japan . | |

*Primary Examiner*—Bernard Codd
*Attorney, Agent, or Firm*—Oblon, Spivak, McClelland, Maier & Neustadt, P.C.

[57] ABSTRACT

A polysilicon film which realizes an excellent ohmic contact is obtained. A board 4 to which a silicon substrate 3 is fixed is disposed within a chamber 1. An $SiH_4$ gas, an $N_2$ gas, a TEOS gas and an anhydrous HF gas are introduced into the chamber 1, through valves 8a, 8b, 8c and 8d, respectively. By means of a pump 7 through a valve 6, the air inside the chamber 1 is exhausted. The chamber 1 is heated up by a heater 2. First, the $N_2$ gas, the TEOS gas and the anhydrous HF gas are introduced into the chamber 1, to remove a silicon natural oxidation film 34 which is formed on the silicon substrate 3. Next, after exhausting the air inside the chamber 1, the $SiH_4$ and the $N_2$ gas are introduced into the chamber 1, to form a polysilicon film 35 on the silicon substrate 3. Since the silicon natural oxidation film 34 and particles do not exist between the silicon substrate 3 and the polysilicon film 35 by employing this process, the polysilicon film 35 having an excellent ohmic contact is obtained.

18 Claims, 4 Drawing Sheets

APPARATUS FOR MANUFACTURING SEMICONDUCTOR DEVICE AND METHOD OF REMOVING SILICON OXIDATION FILM

BACKGROUND OF THE INVENTION

1. Field of the Invention

The present invention relates to a technique for removing a silicon natural oxidation film which is formed on a silicon substrate and realizing an ohmic contact during manufacturing of a semiconductor device which is formed on the silicon substrate.

2. Description of Related Art

Normally, a semiconductor device comprising a silicon substrate includes a polysilicon film for creating electric connection to a diffusion layer which is formed in the upper part of the silicon substrate.

FIG. 6 is a conceptual view showing a structure of a conventional polysilicon film manufacturing apparatus. Silicon substrates 3 are supported upright on a quartz boat 4 within a quartz chamber 1, and the air inside the quartz chamber 1 is exhausted by a dry pump 7 through a vacuum exhaustion pipe 5. The pressure inside the quartz chamber 1 is adjusted by means of a pressure control valve 9 which is attached to the vacuum exhaustion pipe 5 while heating the quartz chamber 1 by a heater 2, during which an $N_2$ gas is introduced into the quartz chamber 1 through an air operate valve 8a as a carrier gas to carry an $SiH_4$ gas into the quartz chamber 1 through the air operate valve 8b. At this stage, a main valve 6 is open. Low pressure chemical vapor deposition realized by this makes it possible to form a polysilicon film.

On surfaces of diffusion layers of the silicon substrates 3, silicon natural oxidation films are formed due to oxygen which is contained in air. If polysilicon films are formed on the diffusion layers with the silicon natural oxidation films left as they are, the silicon natural oxidation films make it difficult to realize an excellent ohmic contact between the diffusion layers and the polysilicon films. To avoid this inconvenience, a mixed solution of pure water and hydrofluoric acid is conventionally used to remove the silicon natural oxidation films before creating the polysilicon films.

However, when such a mixed solution as above is used, particles contained in the mixed solution adhere to the surfaces of the silicon substrates 3. Further, the silicon natural oxidation films grow once again during the storage period of the silicon substrates 3 between removal of the silicon natural oxidation films by means of the mixed solution and deposition of the polysilicon films.

SUMMARY OF THE INVENTION

A first aspect of the present invention is directed to a method of removing a silicon oxidation film, which comprises the steps of: (a) generating a first substance which includes a hydrogen radical, from alkoxysilane and anhydrous HF, (b) generating a fluoride-free radical, from the first substance and anhydrous HF, and (c) generating fluorinated silicon, from the fluoride-free radical and silicon oxide.

According to a second aspect of the present invention, in the method of removing a silicon oxidation film of the first aspect, the steps above are performed within a container which can isolate the inside of itself from outside.

According to a third aspect of the present invention, in the method of removing a silicon oxidation film of the second aspect, a silicon oxidation film which is formed on a surface of a silicon substrate is removed by the method as described above, and the method further comprises the step (d) of forming a polysilicon film on the surface from which the silicon oxidation film is removed.

According to a fourth aspect of the present invention, in the method of removing a silicon oxidation film of the first or the third aspect, the alkoxysilane is specifically tetraethylorthosilicate (TEOS).

According to a fifth aspect of the present invention, in the method of removing a silicon oxidation film of the fourth aspect, the steps (a) through (c) are performed at 600° C. while the step (d) is performed at 600 to 650° C.

A sixth aspect of the present invention is directed to an apparatus for manufacturing a semiconductor device, which has a function of individually controlling introductions of alkoxysilane, anhydrous HF, and a gas which is needed to grow a polysilicon film into the same container.

According to a seventh aspect of the present invention, in the apparatus for manufacturing a semiconductor device of the sixth aspect, the container can isolate the inside of itself from outside.

Accordingly, an object of the present invention is to provide a silicon oxidation film removing method which prevents adhesion of particles, etc. Another object of the present invention is to provide a polysilicon film generating method which prevents re-growth of silicon oxide, including the removing method above. Still another object of the present invention is to provide an apparatus to which these methods are applicable.

In the structure according to the first aspect of the present invention, use of an alkoxysilane gas and anhydrous HF makes it possible remove a silicon oxidation film by a dry process. This prevents adhesion of particles or the like to a surface from which the silicon oxidation film is removed.

In the structure according to the second aspect of the present invention, natural growth of the silicon oxidation film is prevented since introduction of oxygen into the container which is isolated is prevented.

In the structure according to the third aspect of the present invention, since presence of particles and natural growth of the silicon oxidation film are avoided due to the structure according to the second aspect, it is possible to form a polysilicon film which has an excellent ohmic contact with the silicon substrate.

In the structure according to the fourth aspect of the present invention, it is possible to remove the silicon oxidation film by means of TEOS which is generally used to deposit a silicon oxidation film and which is easily available. This makes it easy to bring the present invention into actual application.

In the structure according to the fifth aspect of the present invention, particularly to the third aspect of the present invention, since there is not a large difference between the temperature which is needed at the steps (a) through (c) for removing the silicon oxidation film and the temperature which is needed at the step (d) for depositing the polysilicon film, an apparatus which is used to control the temperatures may be a simple apparatus. Further, since a time needed to proceeds from removal of the silicon oxidation film to deposition of the polysilicon film is shortened, a waiting time is shortened. As a result, a time which is necessary to manufacture a semiconductor device is shortened, which in turn increases a throughput per a unit time.

In addition, it is possible to remove the silicon oxidation film at a temperature which does not exceed the temperature which is needed for depositing the polysilicon film. Hence, it is possible to obtain a semiconductor manufacturing apparatus for realizing the method of removing a silicon oxidation film according to the present invention, using an apparatus which is conventionally used for depositing a polysilicon film. This makes it easy to bring the present invention into actual application.

In the structure according to the sixth aspect of the present invention, it is possible to individually introduce a gas which is needed to remove the silicon oxidation film and a gas which is needed to deposit the polysilicon film, each into the same container. This allows removal of the silicon oxidation film and deposition of the polysilicon film to be performed within one semiconductor manufacturing apparatus. Since it is not necessary to prepare an apparatus for removing the silicon oxidation film and an apparatus for depositing the polysilicon film separately from each other, the semiconductor manufacturing apparatus is simple and a manufacturing cost is reduced.

Further, since removal of the silicon oxidation film and deposition of the polysilicon film are performed successively within one container, it is not necessary to move the silicon substrate between the removing operation and the depositing operation unlike in the conventional technique. This reduces labor related to manufacturing of a semiconductor device.

In the structure according to the seventh aspect of the present invention, it is possible to perform removal of the silicon oxidation film using alkoxysilane and anhydrous HF and deposition of the polysilicon film within the same container. Since introduction of oxygen into the container is prevented, it is possible to prevent natural growth of the silicon oxidation film from after removal of the silicon oxidation film until deposition of the polysilicon film.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
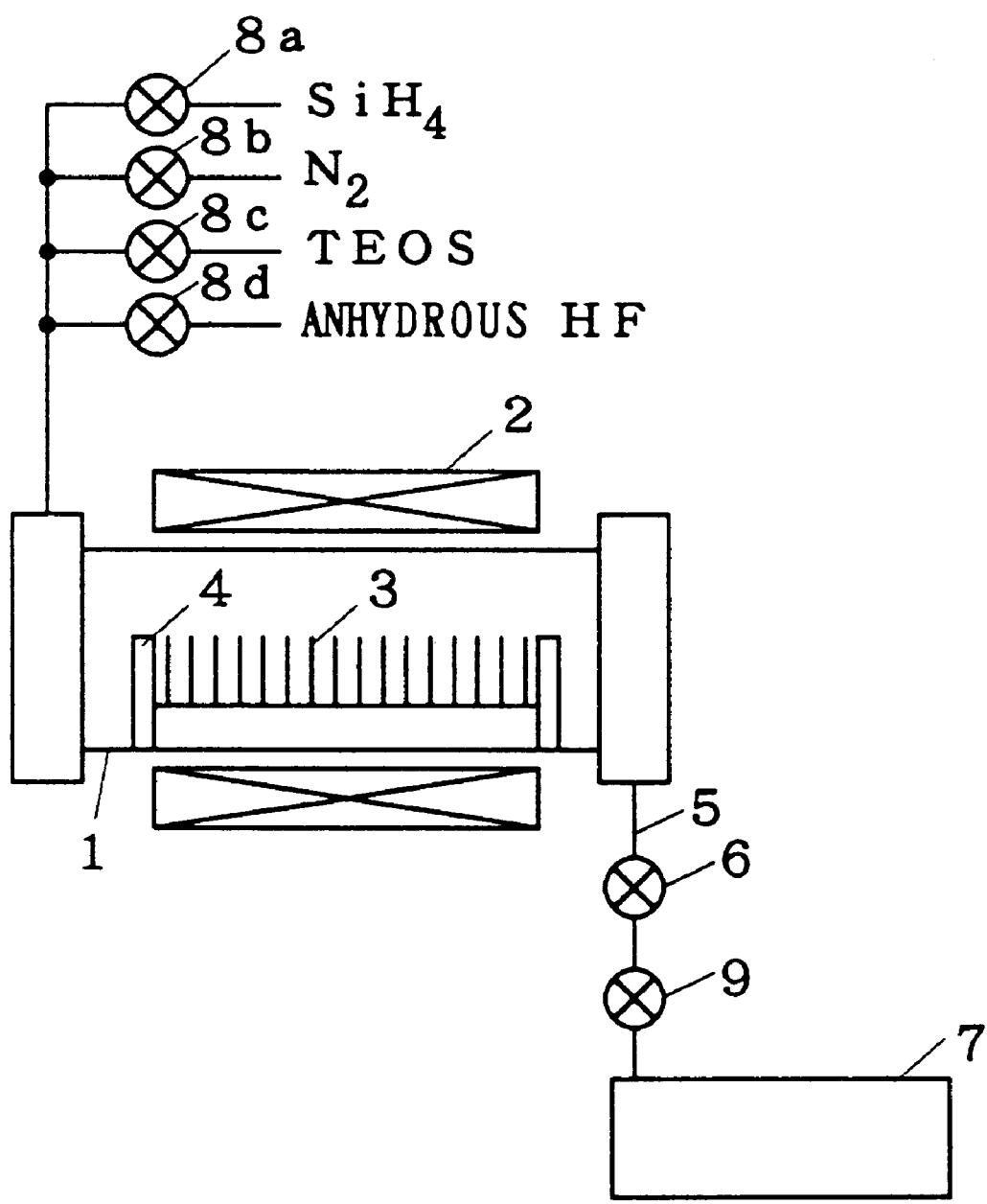
FIG. 1 is a conceptual view showing a structure of an apparatus for forming a polysilicon film according to the present invention.
Figure 6:
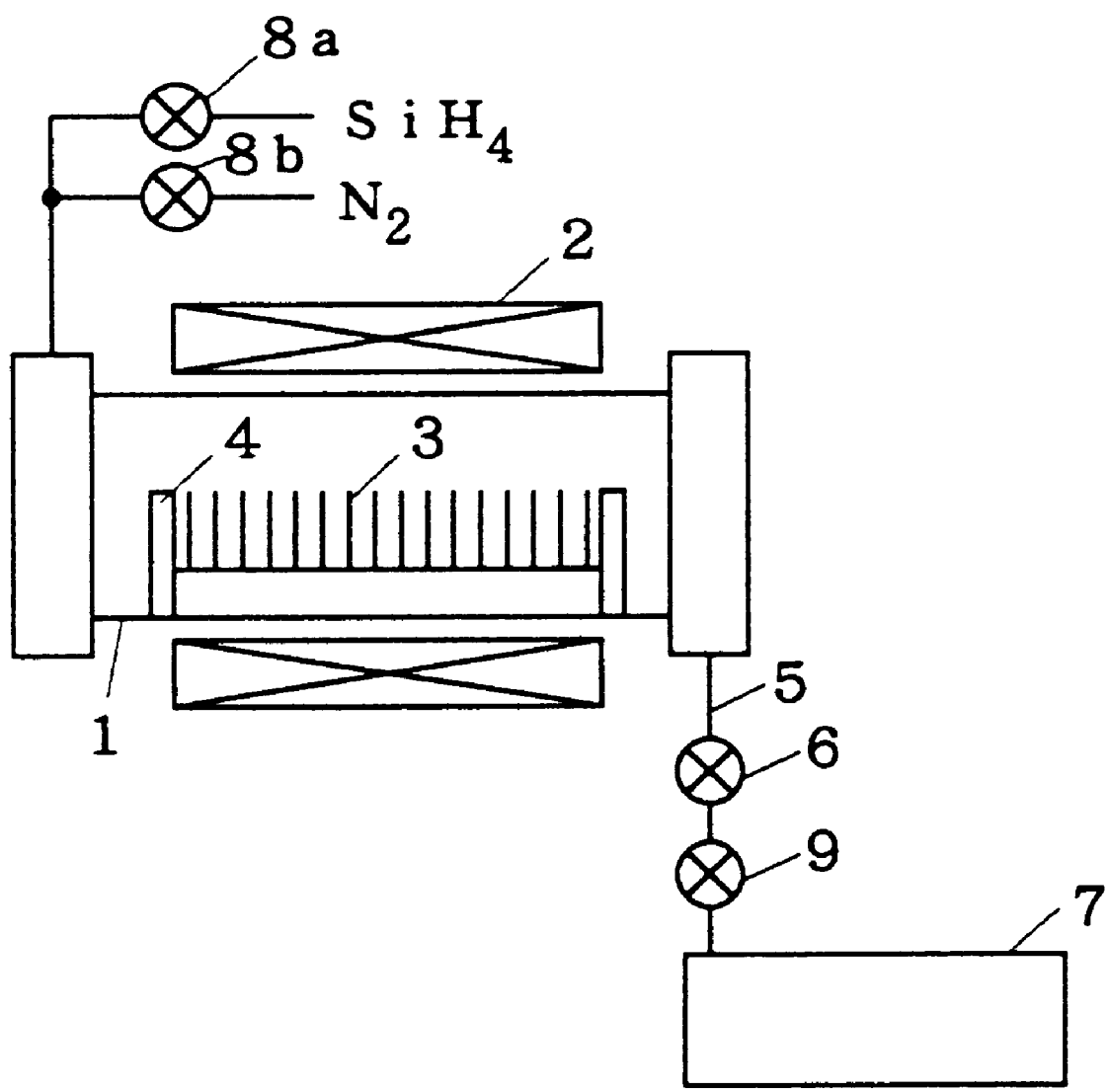
FIG. 6 is a conceptual view showing a structure of a conventional apparatus for forming a polysilicon film.

FIG. 1 is a conceptual view showing a structure of an apparatus for forming a polysilicon film according to a preferred embodiment of the present invention. The same exhaustion system and heating mechanism as those of the conventional manufacturing apparatus shown in FIG. 6 may be used.

A difference however is that air operate valves $8a$ to $8d$ introduce respectively not only an $SiH_4$ gas and an $N_2$ gas but also a TEOS gas which is one type of alkoxysilane gases and an anhydrous HF gas. The air operate valves $8a$ to $8d$ will be collectively referred to as "air operate valves 8."

An alkoxysilane gas is a gas which is expressed by a general formula $(RO)_n \cdot SiA_{4-n}$ or $(RO)_n \ SiR'_{4-n}$. In the general formula, the symbols R and R' each independently denote an alkyl radical, an aryl radical, a glycidoxyalkyl radical, an acryloxyalkyl radical, a methacryloxyalkyl radical or a vinyl radical. The symbol A denotes a halide atom and the symbol n denotes an optional integer from 1 to 4.

In the present invention, TEOS (Tetraethyl orthosilicate) is preferably used as the alkoxysilane gas. This is because the TEOS gas is gas which is generally used to grow an $SiO_2$ film by a CVD method, as described below:

Si $(OC_2H_5)_4 \rightarrow SiO_2$+by-products　　　　Chemical Formula 1

A TEOS gas is easily available and a method of treating the TEOS gas is widely known, which makes use of the TEOS gas suitable to the present invention. Unless especially required in preferred embodiments of the present invention, a TEOS gas is used as an alkoxysilane gas in the preferred embodiments which will be described below.

Figure 2:
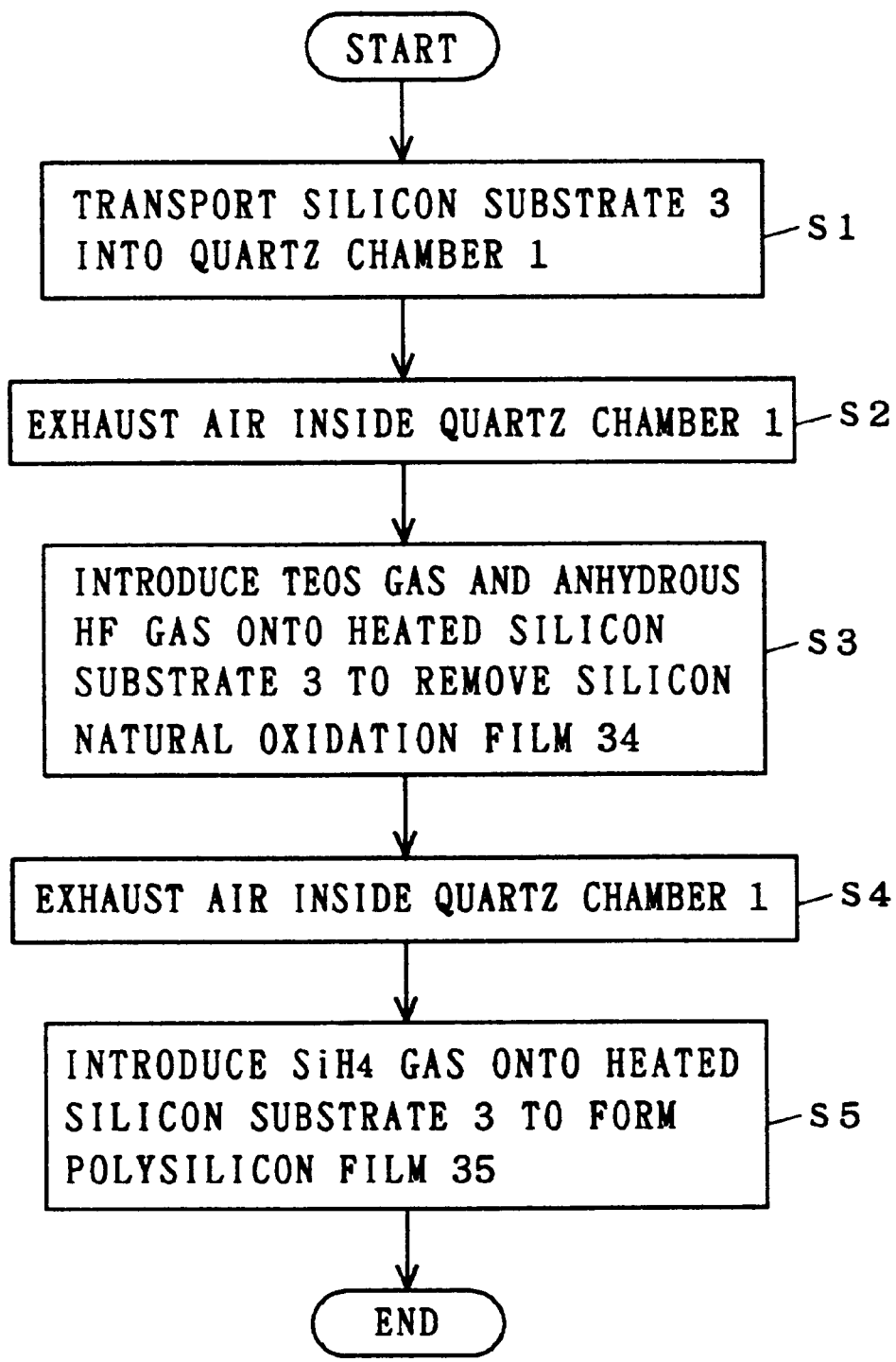
FIG. 2 is a flow chart of a method of forming a polysilicon film according to the present invention.

FIG. 2 is a flow chart showing a method of forming a polysilicon film according to a preferred embodiment of the present invention. First, silicon substrates 3 are each fixed upright on a quartz boat 4. The silicon substrates 3 are disposed with a space between each other so as not to prevent a reaction which is caused by gases. The quartz boat 4 seating the silicon substrates 3 is transported into a quartz chamber 1 (Step S1).

Figure 3:
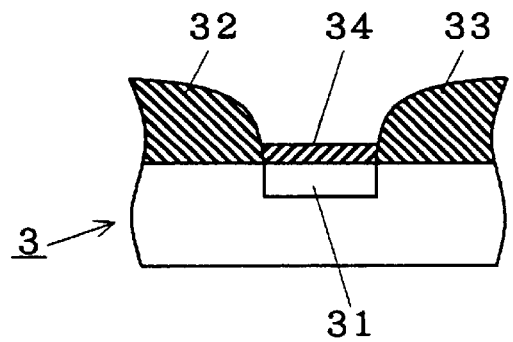
FIG. 3 is a cross sectional view showing an example of a silicon substrate as it is with a silicon natural oxidation film formed thereon.

Next, the air operate valves 8 are all closed, and with the main valve 6 open, the air inside the quartz chamber 1 is exhausted by means of a dry pump 7. The air inside the quartz chamber 1 is exhausted until the pressure inside is reduced to about $10^{-3}$ Torr ($1.3 \times 10^{-1}$ Pa), for example (Step S2). FIG. 3 is a cross sectional view showing an example of a structure of the silicon substrates 3 as it is at the end of Step S2. A diffusion layer 31 is not covered with insulation films 32 and 33, but is covered with a silicon natural oxidation film 34.

Following this, at Step S3, the air operate valves $8b$ to $8d$ are opened to introduce a TEOS gas and an anhydrous HF gas together with an $N_2$ gas which is a carrier gas, into the quartz chamber 1. For instance, the TEOS gas, the $N_2$ gas and the anhydrous HF gas are introduced at flow rates of 10 cc/min, 500 cc/min and 1,000 cc/min, respectively. A pressure controller adjusts the pressure inside the quartz chamber 1 to about 1.0 Torr ($1.3 \times 10^2$ Pa), for example. Meanwhile, the gases inside the quarts chamber 1 are heated to a temperature of 600° C., by the heater 2. This causes the following reaction:

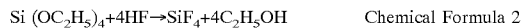

Si $(OC_2H_5)_4$+4HF$\rightarrow SiF_4$+4$C_2H_5OH$　　　　Chemical Formula 2

$C_2H_5OH+HF \rightarrow C_2H_5OH_2^+ + F^-$　　　　Chemical Formula 3

$4F+SiO_2 \rightarrow SiF_4 + O_2 + 4e^-$　　　　Chemical Formula 4

The chemical reaction as that expressed as Chemical Formula 2 creates ethyl alcohol which includes an OH radical. It is this OH radical that leads the chemical reactions to Chemical Formulas 3 and 4 along which HF dissolves $SiO_2$.

A chemical reaction regarding an alkoxysilane gas in general is expressed as below. Chemical Formula 2 changes to:

  Chemical Formula 5

  Chemical Formula 6

Chemical Formula 3 changes to:

$$ROH + HF \rightarrow ROH_2^+ + F^-$$  Chemical Formula 7

Such reactions as above remove the silicon natural oxidation film 34 (Step S3). As can be understood from the foregoing, only HF and OH radicals are necessary to remove the silicon natural oxidation film 34.

Figure 4:
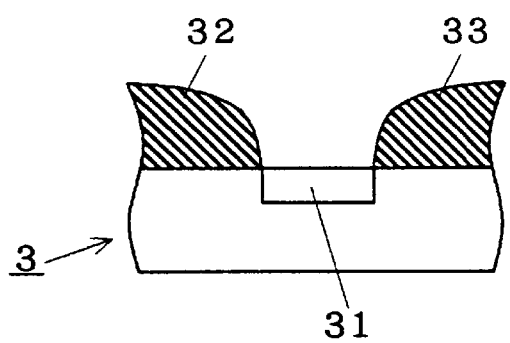
FIG. 4 is a cross sectional view showing a step during the method of forming a polysilicon film according to the present invention.

FIG. 4 is a cross sectional view showing an example of a structure of the silicon substrate 3 as it is created by processing up to Step S3. Unlike in the structure shown in FIG. 3, the silicon natural oxidation film 34 is removed.

Next, with the silicon substrates 3 left within the quartz chamber 1 and the air operate valves 8 all closed, the main valve 6 is opened to exhaust the air inside the quartz chamber 1 so that the pressure within the quartz chamber 1 is reduced again to about $10^{-3}$ Torr ($1.3 \times 10^{-1}$ Pa) (Step S4).

At this stage, of the air operate valves 8, only the air operate valve 8b is opened to allow the $N_2$ gas to remove the TEOS and the anhydrous HF which remain within the quartz chamber 1 and chemical substances which are created during the processes as expressed by Chemical Formulas 2 to 4. The air operate valve 8b may be closed following this, to reduce the pressure within the quartz chamber 1.

Next, the air operate valves 8a and 8b are opened, to introduce the $SiH_4$ gas into the quartz chamber 1, using the $N_2$ as a carrier gas. The pressure control valve 9 is adjusted so that the total pressure of the $N_2$ gas and the $SiH_4$ gas becomes about 0.2 to 1.0 Torr (0.27 to $1.3 \times 10^2$ Pa). The heater 2 heats up the temperature within the quartz chamber 1 to about 600 to 650° C., whereby growth of a polysilicon film 35 as expressed below progresses (Step S5).

  Chemical Formula 8

During the processes as described above, it is possible to remove the silicon natural oxidation film 34 by a dry process within a space which is separated from outside atmosphere, without using a solution. Hence, there is no problem such as adhesion of particles, unlike in the conventional technique.

Figure 5:
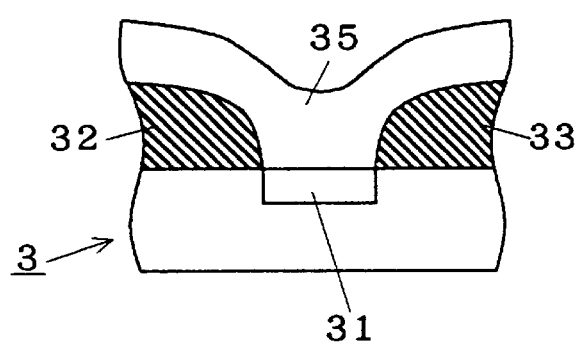
FIG. 5 is a cross sectional view showing a step during the method of forming a polysilicon film according to the present invention.

In addition, since manufacturing proceeds to generation of the polysilicon film 35 still in the space which is separated from outside atmosphere, oxygen does not flow into the quartz chamber 1, which prevents re-growth of the silicon natural oxidation film 34. FIG. 5 is a cross sectional view showing an example of a structure which is obtained by the processes up to Step S5.

Thus, according to the present invention, since the silicon natural oxidation film 34 is removed by using the alkoxysilane gas and the anhydrous HF gas, particles or the like do not exist on the diffusion layer 31 after the silicon natural oxidation film 34 is removed. Further, since removal of the silicon natural oxidation film 34 and generation of the polysilicon film 35 are performed successively within the quartz chamber 1, it is possible to prevent the silicon natural oxidation film 34 from growing again on the diffusion layer 31. Hence, it is possible to obtain the polysilicon film 35 which is in an excellent ohmic contact with the diffusion layer 31.

Further, since removal of the silicon natural oxidation film 34 and generation of the polysilicon film 35 are performed successively within the quartz chamber 1, the present invention requires less labor than in the conventional technique which demands to form the polysilicon film 35 on the silicon substrate 3 within the quartz chamber 1 after removing the silicon substrate 3 from the mixed solution and performing cleansing. This makes it possible to manufacture a semiconductor device efficiently.

Now, a description will be given on the reason that use of the TEOS gas, in particular, as the alkoxysilane gas is very useful. The chemical reactions which are expressed as Chemical Formulas 2 to 4 for removing silicon oxide using the TEOS gas progress at 600° C. Since the chemical reaction which is expressed as Chemical Formula 8 for depositing the polysilicon film progresses at 600 to 650° C., the temperatures needed for removal and deposition are very close to each other. This shortens a waiting time from the removal step to the deposition step, and therefore, the efficiency of manufacturing a semiconductor is improved. In addition, since the heater 2 only needs to operate within a relatively narrow range of operating temperature from 600 to 650° C., it is not necessary to use a heater which operates at a relatively wide range of operating temperature.

Further, use of the TEOS gas does not allow the temperature, which is necessary in the present invention to remove silicon oxide, to exceed the temperature which is necessary in widely used conventional methods to deposit the polysilicon film. Hence, even the heat-resisting temperature which is conventionally set for the quartz chamber 1 for deposition of the polysilicon film sufficiently covers the temperature which is necessary in the present invention to remove the silicon oxidation film. A similar discussion is true with the heater 2 as well. Hence, it is possible to remove the silicon oxidation film according to the present invention, using a conventional apparatus for generating a polysilicon film.

As described above, the present invention is very useful to form a polysilicon film which is to be in an ohmic contact with a diffusion film on a silicon substrate.

While the invention has been described in detail, the foregoing description is in all aspects illustrative and not restrictive. It is understood that numerous other modifications and variations can be devised without departing from the scope of the invention.

I claim:

1. An apparatus for removing a silicon oxide film, comprising:
   a first gas source comprising anhydrous HF,
   a second gas source comprising an alkoxysilane,
   a third gas source comprising $SiH_4$,
   a chamber,
   a first gas controller, connected to said first gas source and said chamber,
   a second gas controller, connected to said second gas source and said chamber,
   a third gas controller, connected to said third gas source and said chamber, and
   an exhaust system, connected to said chamber.

2. The apparatus of claim 1, wherein said alkoxysilane is tetraethylorthosilicate.

3. The apparatus of claim 1, further comprising a heater for heating said chamber.

4. An apparatus for removing a silicon oxide film, comprising:
   a first gas source comprising anhydrous HF,
   a second gas source comprising an alkoxysilane,
   a third gas source comprising $SIH_4$,
   first means for removing a silicon oxide film from a silicon substrate, and
   second means for introducing said anhydrous HF from said first gas source to said first means, third means for introducing said alkoxysilane from said second gas source to said first means, and fourth means for introducing said $SIH_4$ from said third gas source to said first means.

5. The apparatus of claim 4, wherein said alkoxysilane is tetraethylorthosilicate.

6. In an apparatus for depositing polysilicon having a chamber, an exhaust system for removing gas from the chamber, a heater for heating a sample in the chamber, and controllers for controlling the introduction of gasses, the improvement comprising a source of anhydrous HF, a source of an alkoxysilane, and controllers for controlling the introduction of the anhydrous HF and the alkoxysilane, for the removal of a silicon oxide film from the substrate prior to depositing polysilicon.

7. The apparatus of claim 6, wherein said alkoxysilane is tetraethylorthosilicate.

8. An apparatus for manufacturing a semiconductor device, comprising:

a chamber capable of containing a semiconductor substrate;

a first gas source for supplying a reaction gas, said reaction gas causing chemical vapor deposition on said semiconductor substrate to thereby deposit a polycrystalline semiconductor thereon;

a second gas source for supplying carrier gas;

a third gas source for supplying alkoxysilane;

a fourth gas source for supplying anhydrous HF;

a first gas controller interposed between said first gas source and said chamber for controlling an introduction of said reaction gas into said chamber;

a second gas controller interposed between said second gas source and said chamber for controlling an introduction of said carrier gas into said chamber;

a third gas controller interposed between said third gas source and said chamber for controlling an introduction of said alkoxysilane into said chamber;

a fourth gas controller interposed between said fourth gas source and said chamber for controlling an introduction of said anhydrous HF into said chamber; and an exhaust unit connected to said chamber.

9. The apparatus of claim 8, further comprising:

a heater for heating said chamber.

10. The apparatus of claim 9, wherein said third gas source supplies tetraethylorthosilicate as said alkoxysilane.

11. The apparatus of claim 10, wherein said first gas source supplies $SiH_4$ as said reaction gas.

12. The apparatus of claim 11, wherein said second gas source supplies $N_2$ as said carrier gas.

13. The apparatus of claim 8, wherein said first to fourth gas controllers have first to fourth valves, respectively.

14. The apparatus of claim 13, wherein each of said first to fourth valves is an air operated valve.

15. The apparatus of claim 8, wherein said exhaust unit comprises:

a pump; and a valve interposed between said chamber and said pump.

16. The apparatus of claim 15, wherein said valve is a pressure control valve.

17. The apparatus of claim 15, wherein said pump is a dry pump.

18. The apparatus of claim 8, wherein said chamber is a quartz chamber.

* * * * *